United States Patent [19]
Hsue

[11] Patent Number: 5,430,328
[45] Date of Patent: Jul. 4, 1995

[54] PROCESS FOR SELF-ALIGN CONTACT

[75] Inventor: Chen-Chiu Hsue, Hsin-Chu, Taiwan

[73] Assignee: United Microelectronics Corporation, Hsinchu, Taiwan

[21] Appl. No.: 251,501

[22] Filed: May 31, 1994

[51] Int. Cl.6 .................... H01L 23/48; H01L 21/44
[52] U.S. Cl. .................... 257/750; 257/751;
257/754; 257/757; 257/763; 257/764; 257/773;
437/190; 437/192; 437/194; 437/203; 437/228;
437/235
[58] Field of Search ............. 257/750, 751, 754, 757,
257/763, 764, 773; 437/190, 192, 194, 203, 228,
235

[56] References Cited

U.S. PATENT DOCUMENTS

| | | | |
|---|---|---|---|
| 4,713,356 | 12/1987 | Hiruta | 437/41 |
| 4,804,560 | 2/1989 | Shioya et al. | 427/125 |
| 4,898,841 | 2/1990 | Ho | 437/200 |
| 4,906,593 | 3/1990 | Shioya et al. | 437/192 |
| 5,212,400 | 5/1993 | Joshi | 257/412 |
| 5,300,813 | 4/1994 | Joshi et al. | 257/757 |

Primary Examiner—Edward Wojciechowicz
Attorney, Agent, or Firm—George O. Saile; Stephen B. Ackerman

[57] ABSTRACT

A method and structure for manufacturing a self-aligned contact, for connecting conductive lines to active regions in a silicon substrate, is described. There is a first insulating layer over the silicon substrate, with openings over the active regions. A barrier metal layer is formed over the active regions, along surfaces of the openings, and over a portion of the horizontal surfaces of the first insulating layer in the region adjacent to the openings. There is a refractory metal layer over the barrier metal layer. Conductive lines are self-aligned over the barrier metal layer and over the refractory metal layer. Sidewall spacers are formed adjacent to the conductive lines and over those regions of the refractory metal layer not covered by the conductive lines.

25 Claims, 4 Drawing Sheets

PROCESS FOR SELF-ALIGN CONTACT

BACKGROUND OF THE INVENTION

1. Field of the Invention

The invention relates to the manufacture of highly dense integrated circuits, and more particularly to the formation of a self-aligned contact between interconnecting conductive lines and devices within the integrated circuit.

2. Description of the Related Art

In the manufacture of highly dense integrated circuits, semiconductor devices formed in and on a silicon substrate need to be connected to each other, and to other devices or connections external to the chip on which the device is formed. Interconnections are formed of a conductive film, such as polysilicon or aluminum. Desirable characteristics of these films include, among others, low resistivity, stability throughout processing, good adherence, and ease of formation and patterning. As device dimensions have steadily been reduced, shallower junctions are formed in the active regions, which places further demands on the contact and interconnect metallization. Avoidance of spiking shorts, good step coverage for narrow contact windows and low contact resistance become important characteristics for the shallow junctions and small lateral dimensions of devices formed at dimensions in the range of about 1.0 micrometer and less.

For contacts, aluminum has been satisfactory at larger dimensions due to its ease of processing, ability to reduce native silicon dioxide, and low resistivity. However, at smaller dimensions, aluminum leads to spiking shorts (due to deep penetration of metal shorts into the semiconductor) and contact depths that are a significant fraction of the junction depth. Tungsten is a possible substitute for aluminum interconnections. However, its resistivity of 8–10 microohms-centimeters (um-cm) is about 3 times that of aluminum (2.7 um-cm), so the tungsten thickness needs to be minimized.

For these and other reasons, it has been suggested to use tungsten plugs in the contact windows, and connecting to the plugs by a subsequent deposition of aluminum to form conductive lines. For example, in U.S. Pat. No. 4,713,356 (Hiruta), U.S. Pat. No. 4,804,560 (Shioya et al), and U.S. Pat. No. 4,898,841 (Ho) tungsten is used to fill the contact holes and make contact with the device active regions, and aluminum formed to connect to the tungsten plugs. However, this requires accurate alignment to insure connection between the aluminum and tungsten, and the metal overlap contact is limited by alignment accuracy.

SUMMARY OF THE INVENTION

Accordingly, it is a principal object of the invention to provide a self-aligned contact structure, and a method for manufacturing such a structure, that is not limited by alignment accuracy.

It is a further object of the invention to provide a self-aligned contact structure, and a method for manufacturing such a structure, that improves the aluminum overlap contact rule.

It is a further object of the invention to provide a self-aligned contact structure, and a method for manufacturing such a structure, that improves layout density.

It is a further object of the invention to provide a self-aligned contact structure, and a method for manufacturing such a structure, that improves the step coverage of the intermetal dielectric.

These objects are achieved by a self-aligned contact connecting conductive lines to active regions in a silicon substrate. There is a first insulating layer over the silicon substrate, with openings over the active regions. A barrier metal layer is formed over the active regions, along surfaces of the openings, and over a portion of the horizontal surfaces of the first insulating layer in the region adjacent to the openings. There is a refractory metal layer over the barrier metal layer. Conductive lines are self-aligned over the barrier metal layer and over the refractory metal layer. Sidewall spacers are formed adjacent to the conductive lines and over those regions of the refractory metal layer not covered by the conductive lines.

These objects are further achieved by a method of forming a self-aligned contact to active regions in a silicon substrate, through a first insulating layer. An opening is formed in the first insulating layer, to expose the active regions. A barrier metal layer is formed over the first insulating layer and in the opening. A refractory metal layer is formed over the barrier metal layer. A conductive metal layer is formed over the refractory metal layer. The conductive metal layer is patterned to form conductive lines over the active regions. Insulating spacer sidewalls are formed adjacent to the conductive lines. The barrier metal layer and refractory metal layer are removed in areas not vertically masked by the insulating spacer sidewalls and the conductive lines.

DESCRIPTION OF THE PREFERRED EMBODIMENTS

Figure 1:
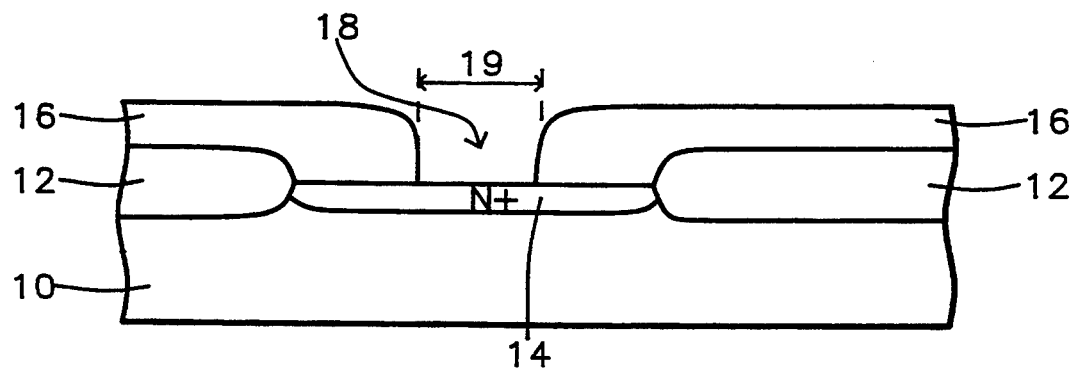
FIGS. 1 to 5 are a cross-sectional representation of the method and resulting structure of the invention for forming a self-aligned contact.

Referring now to FIG. 1, a silicon substrate 10 is shown on which has been formed field oxide regions 12 and a semiconductor junction, or active region, 14. The method of formation of these structures is well known and will not be described further, as they are not significant to the invention. Subsequently, an insulating layer 16 is formed over the surfaces of the field oxide and active region by depositing an insulating material such as BPSG (borophosphosilicate glass) by APCVD (Atmospheric Pressure Chemical Vapor Deposition) with a gaseous mixture of $SiH_4/O_2/PH_3/B_2H_6$ (silane/oxygen/phosphorus hydride/boron hydride) at a temperature of about 450° C. This results in a thickness for the BPSG layer of between about 3000 and 10,000 Angstroms. Contact opening 18 is formed in this layer by an anisotropic reactive ion etch (RIE) using $O_2/CHF_3$ (oxygen/fluoromethane) at a pressure of about 50 mtorr. The contact size 19 is between about 0.25 and 1.0 micrometers.

Figure 2:
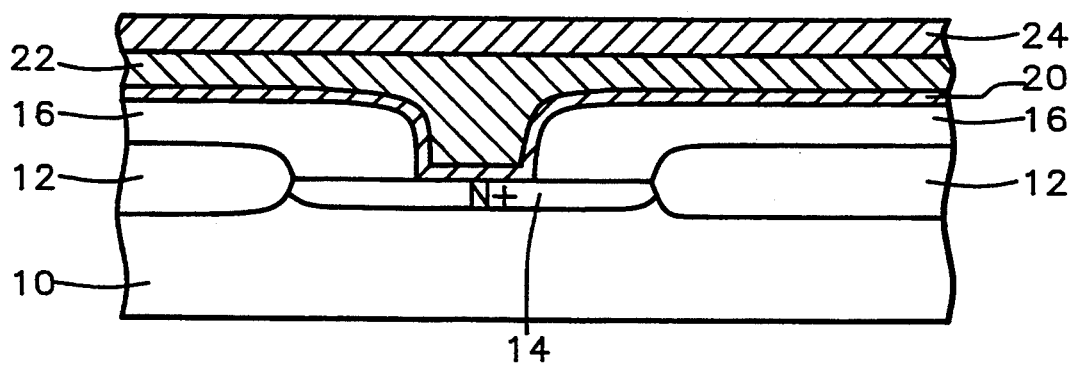

With reference to FIG. 2, a barrier layer 20 is deposited over BPSG layer 16 and within opening 18, both on the surface of the active region 14 and on the walls of the opening. This barrier layer may be formed by sputtering titanium tungsten (TiW), or by forming titanium/titanium nitride (Ti/TiN). To form Ti/TiN, titanium is sputtered and is followed by a Rapid Thermal Anneal (RTA) in $N_2$ (nitrogen) or $NH_3$ (ammonia) gas at between about 750° and 850° C. to form $TiSi_2$/TiN (titanium silicide/titanium nitride) layers. The barrier layer 20 is formed to a thickness of between about 300 and 1500 Angstroms. This layer primarily is formed to provide improved adhesion between the subsequently deposited tungsten (W) and the underlying silicon substrate. The barrier layer also helps prevent aluminum (Al) spiking.

A subsequent conductive film is deposited to form layer 22, which fills the contact opening and is also deposited over the horizontal surfaces of the barrier layer 20 outside of the contact opening. This layer is formed of tungsten (W) and is deposited by LPCVD (Low Pressure Chemical Vapor Deposition) in $WF_6$/$SiH_4$ (tungsten fluoride/silane) at about 400° C., to a thickness of between about 2000 and 10,000 Angstroms. This layer serves the purpose of filling the contact to improve metal step coverage, and preventing electromigration. Using aluminum sputtering, it is difficult to get very good step coverage at contact sizes less than about 1.0 micrometers, which induces aluminum electromigration.

Aluminum layer 24 is next deposited over conductive layer 22. Conductive lines will subsequently be formed to complete interconnection of active region 14 to other such regions elsewhere on the substrate (not shown), or to input/output pads. This layer may also be formed of, for example, aluminum alloys or AlSiCu (aluminum silicon copper), and is deposited by metal sputtering to a thickness of between about 2000 and 6000 Angstroms.

Figure 3:
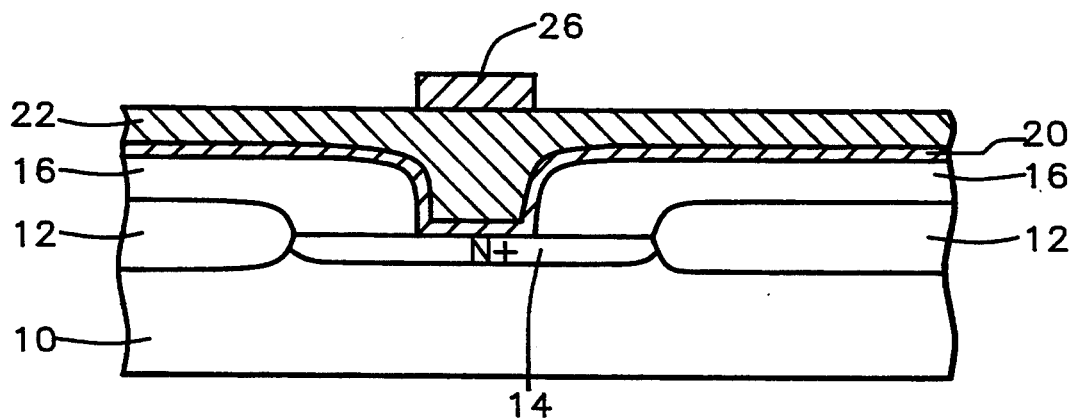

Referring now to FIG. 3, the aluminum layer 24 is patterned, by conventional lithography and etching, to form conductive lines 26, which are aligned over the contact opening and active region 14. Normally, the metal overlap contact is between about 0.3 and 0.5 micrometers, but with the invention the overlap rule can be set to 0.

Figure 4:
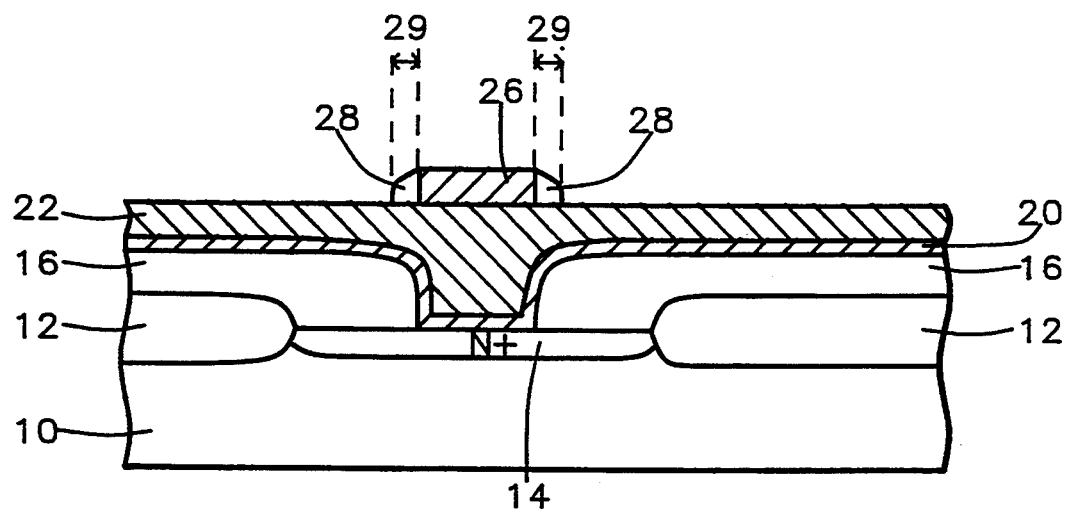

With reference to FIG. 4, an insulating layer is formed over the aluminum line 26 and the exposed surfaces of conductive layer 22. This layer is formed of silicon oxide ($SiO_2$) or silicon nitride ($Si_3N_4$) by chemical vapor deposition, to a thickness of between about 2000 and 5000 Angstroms. In a critical step of the invention, an anisotropic etch is then performed such that sidewall spacers 28 remain, after etching, along the vertical surfaces of aluminum line 26. The spacer width 29 varies with the thickness of the insulating layer, and is between about 0.2 and 0.5 micrometers. A layer thickness of 3000 Angstroms results in a spacer width 29 of about 0.3 micrometers.

Figure 5:
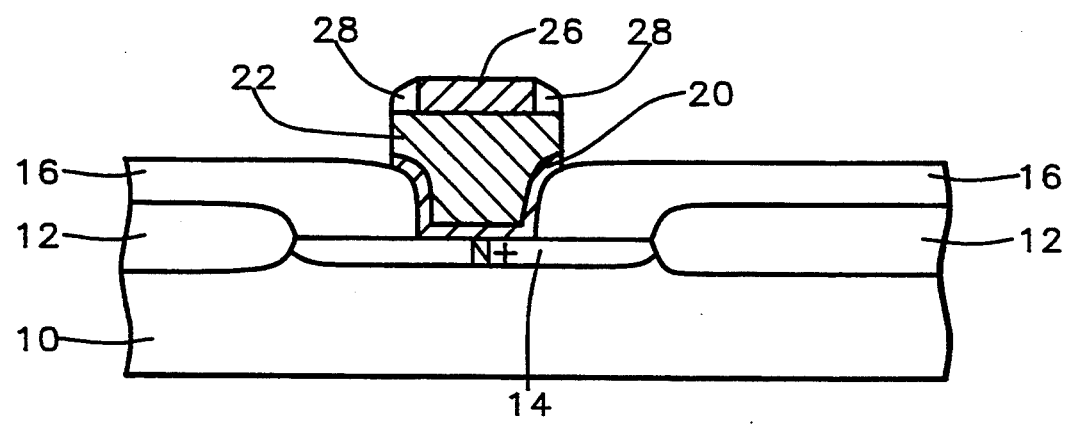

Referring now to FIG. 5, the spacers 28 and aluminum line 26 are used as a mask during an etch of the underlying conductive layer 22 and barrier layer 20. The material of these two layers is removed in all areas other than under the mask by plasma etching, using $SF_6$ (sulfur hexafluoride) or other fluorine-based gases, at a pressure of about 200 mtorr and a temperature of about 20° C. Aluminum lines 26 are not etched because aluminum is not attacked by $SF_6$. Consequently, aluminum lines 26 are self-aligned over conductive layer 22, alignment restrictions of the prior art are avoided, and misalignment of the aluminum conductor 26 up to the width of the spacers 28 can occur without the etch of FIG. 5 extending down to the substrate and active region.

Figure 6:
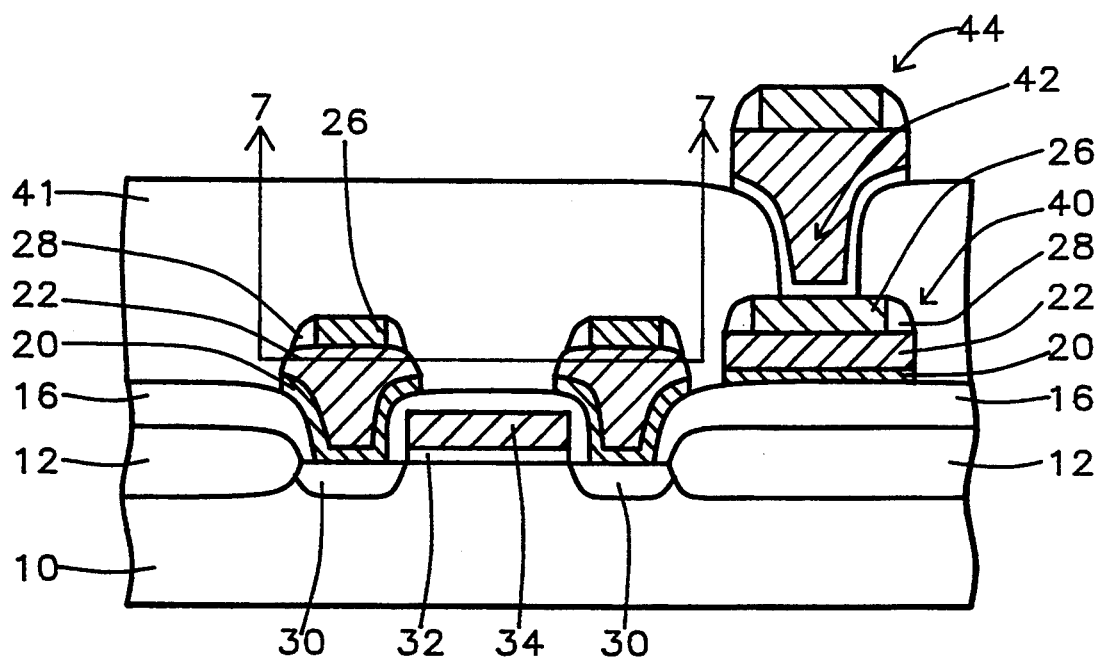
FIG. 6 is a cross-sectional representation of a resultant structure of the invention for two layers of metallization.

The advantages of the invention may be seen further with respect to FIGS. 6, in which the structure of the invention is shown making contact with a field effect transistor (FET) and for a double-metal process. Similar areas and structures have the same identifying reference numbers as in the previous figures. Field oxide regions 12 are formed on a silicon substrate 10. The active regions to which the metallic contacts are made are FET source/drain regions 30, which are separated by a conductive gate 34 over a thin gate oxide 32. Insulating layer 16, formed of, for instance, BPSG, has been deposited and patterned to provide contact openings to the source/drain regions 30. Barrier layer 20, conductive film 22, aluminum lines 26 and spacers 28 are formed as described previously to form the self-aligned contacts of the invention. Conductive line 40 over the field oxide region is formed simultaneously and by the same method as the contacts to the FET source/drain regions 30, and may be used for other interconnections within the integrated circuit.

Due to the desire for increased packaging density, additional layers of metal may be required to form the integrated circuit metallization system. A second layer is shown in FIG. 6, but it will be understood by those familiar with the art that a third or even more layers of metal may be formed using the method of the invention. After completion of the first contacts and conductive line 40, a thick intermetal oxide 41 of, for instance, spin-on glass (SOG) is conformally deposited by coater SOG and spin-dry, as is known in the art, to a thickness of between about 1000 and 3000 Angstroms. A contact opening 42 may now be formed to conductive line 40 for connection to the second layer of metal. The method of the invention is then used to form self-aligned contact 44.

Figure 7:
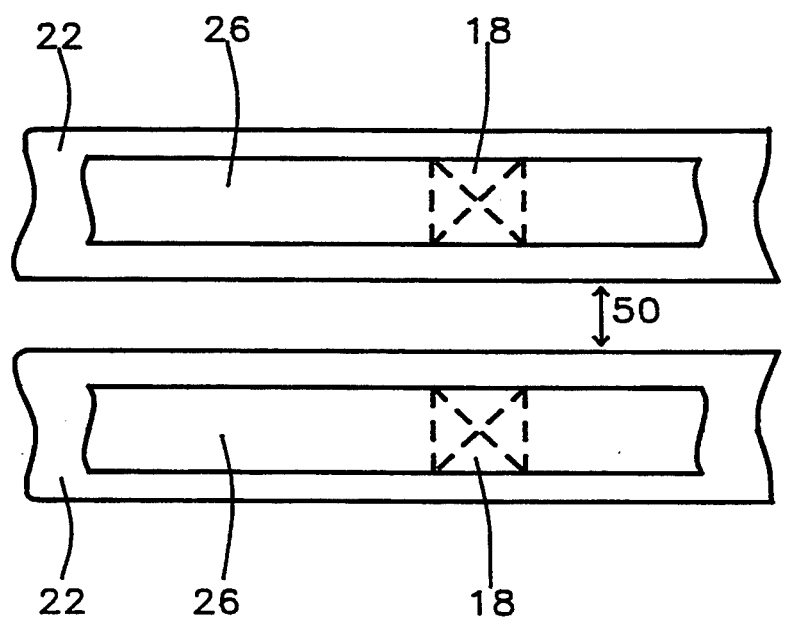
FIG. 7 is a top view along line 7—7 of FIG. 6 of two interconnecting aluminum lines formed by the method of the invention, with self-aligned contacts.

As seen in FIG. 7, a top view taken along line 7—7 of FIG. 6, aluminum line 26 is self-aligned to conductive line 22, and connection is made to the active region by contact 18. The metal overlap contact may be adjusted from −0.2 micrometers to 0.2 micrometers, depending on the spacer size—a larger spacer would allow more negative overlap. Furthermore the distance 50 between conductors may be reduced by the method of the invention below lithographic limitations, allowing for higher layout density.

Figure 8:
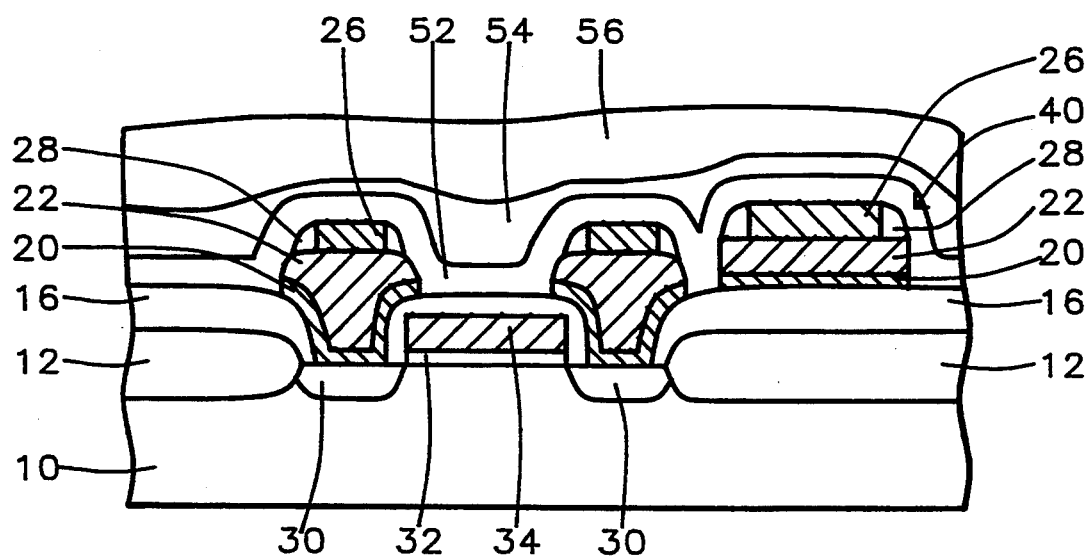
FIG. 8 is a cross-sectional representation of a resulting structure of the invention showing improved planarization of intermetal dielectric or passivation layers.

Referring now to FIG. 8, further advantages of the invention are described. Intermetal dielectric 41 may be formed of successive layers of PECVD (Plasma Enhanced Chemical Vapor Deposition) oxide 52 (or nitride), SOG 54 and PECVD oxide 56 (or nitride). Since the slope of the sidewalls 28 is much less vertical than the slope of a conventional metal line, step coverage of the intermetal dielectric (or passivation) is improved, and planarization by SOG filling is easier. Product reliability is enhanced with this improved planarization.

While the invention has been particularly shown and described with reference to the preferred embodiments thereof, it will be understood by those skilled in the art that various changes in form and details may be made without departing from the spirit and scope of the invention.

What is claimed is:

1. A self-aligned contact connecting conductive lines to active regions in a silicon substrate, comprising:

a first insulating layer over said silicon substrate, with openings over said active regions;

a barrier metal layer over said active regions, along surfaces of said openings, and over a portion of the horizontal surfaces of said first insulating layer in the region adjacent to said openings;

a refractory metal layer over said barrier metal layer;

conductive lines self-aligned over said barrier metal layer and over said refractory metal layer; and sidewall spacers adjacent to said conductive lines and over those regions of said refractory metal layer not covered by said conductive lines.

2. The self-aligned contact of claim 1 wherein said refractory metal layer is tungsten, having a thickness of between about 2000 and 10,000 Angstroms.

3. The self-aligned contact of claim 1 wherein said barrier metal layer has a thickness of between about 300 and 1500 Angstroms.

4. The self-aligned contact of claim 3 wherein said barrier metal layer is titanium tungsten.

5. The self-aligned contact of claim 3 wherein said barrier metal layer is titanium/titanium nitride.

6. The self-aligned contact of claim 1 wherein said conductive lines are aluminum.

7. The self-aligned contact of claim 1 wherein said openings have a width of between about 0.25 and 1.0 micrometers.

8. The self-aligned contact of claim 1 wherein said sidewall spacers are silicon oxide and have a width of between about 0.2 and 0.5 micrometers.

9. A method of forming a self-aligned contact to an active region in a silicon substrate, through a first insulating layer, comprising the steps of:

forming an opening in said first insulating layer, to expose said active region;

forming a barrier metal layer over said first insulating layer and in said opening;

forming a refractory metal layer over said barrier metal layer;

forming a conductive metal layer over said refractory metal layer;

patterning said conductive metal layer to form conductive lines over said active regions;

forming insulating spacer sidewalls adjacent to said conductive lines; and removing said barrier metal layer and refractory metal layer in areas not vertically masked by said insulating spacer sidewalls and said conductive lines.

10. The method of claim 9 wherein said refractory metal layer is formed of tungsten, and is formed to a thickness of between about 2000 and 10,000 Angstroms.

11. The method of claim 9 wherein said barrier metal layer is formed to a thickness of between about 300 and 1500 Angstroms.

12. The method of claim 11 wherein said barrier metal layer is formed of titanium tungsten.

13. The method of claim 11 wherein said barrier metal layer is formed of titanium/titanium nitride.

14. The method of claim 9 wherein said conductive lines are formed of aluminum.

15. The method of claim 9 wherein said openings are formed to a width of between about 0.25 and 1.0 micrometers.

16. The method of claim 9 wherein said forming insulating spacer sidewalls comprises the steps of:

depositing an oxide layer over said conductive lines and exposed surface of said refractory metal layer; and anisotropically etching said oxide layer to remove material from the horizontal surfaces of said conductive lines and said refractory metal layer, and to leave said insulating spacer sidewalls adjacent to said conductive lines.

17. The method of claim 16 wherein said oxide layer is formed to a thickness of between about 2000 and 5000 Angstroms.

18. An integrated circuit with a metallization system of conductive lines in self-aligned contact to the active regions of field effect transistor (FET) devices, comprising:

said field effect transistor devices formed in and on a silicon substrate, isolated from other of said field effect transistor devices by field oxide regions, having said active regions, gate oxide between said active regions, and a gate over said gate oxide;

a first insulating layer over said field effect transistor, with openings in said first insulating layer over said active regions;

a barrier metal layer over said active regions, along surfaces of said openings, and over a portion of the horizontal surfaces of said first insulating layer in the region adjacent to said openings;

a refractory metal layer over said barrier metal layer;

conductive lines self-aligned over said barrier metal layer and over said refractory metal layer; and sidewall spacers adjacent to said conductive lines and over those regions of said refractory metal layer not covered by said conductive lines.

19. The integrated circuit of claim 18 wherein said refractory metal layer is tungsten, having a thickness of between about 2000 and 10,000 Angstroms.

20. The integrated circuit of claim 18 wherein said barrier metal layer has a thickness of between about 300 and 1500 Angstroms.

21. The integrated circuit of claim 20 wherein said barrier metal layer is titanium tungsten.

22. The integrated circuit of claim 20 wherein said barrier metal layer is titanium/titanium nitride.

23. The integrated circuit of claim 18 wherein said conductive lines are aluminum.

24. The integrated circuit of claim 18 wherein said sidewall spacers are silicon oxide and have a width of between about 0.2 and 0.5 micrometers.

25. The integrated circuit of claim 18 wherein said conductive lines may be formed in subsequent metallization layers in self-aligned contact with conductive lines in the preceding layer.

* * * * *